(12) United States Patent
Strange et al.

(10) Patent No.: US 7,649,355 B2
(45) Date of Patent: Jan. 19, 2010

(54) METHOD OF OPERATING A DYNAMIC NUCLEAR POLARIZATION SYSTEM

(75) Inventors: Daniel Robert Strange, Oxfordshire (GB); Robert Andrew Slade, Oxfordshire (GB)

(73) Assignee: Oxford Instruments Molecular Biotools Limited, Oxon (GB)

( * ) Notice: Subject to any disclaimer, the term of this patent is extended or adjusted under 35 U.S.C. 154(b) by 112 days.

(21) Appl. No.: 11/918,053

(22) PCT Filed: Feb. 24, 2006

(86) PCT No.: PCT/GB2006/000653

§ 371 (c)(1),
(2), (4) Date: Oct. 9, 2007

(87) PCT Pub. No.: WO2006/106285

PCT Pub. Date: Oct. 12, 2006

(65) Prior Publication Data

US 2009/0085562 A1 Apr. 2, 2009

(30) Foreign Application Priority Data

Apr. 8, 2005 (GB) ................................ 0507174.1

(51) Int. Cl.
*G01V 3/00* (2006.01)
(52) U.S. Cl. ...................... 324/321; 324/309; 324/307
(58) Field of Classification Search ................. 324/321, 324/309, 307
See application file for complete search history.

(56) References Cited

U.S. PATENT DOCUMENTS

| 6,515,260 | B1 | 2/2003 | Anderson |
| 7,102,354 | B2 * | 9/2006 | Ardenkjaer-Larsen et al. ... 324/321 |
| 7,368,909 | B2 * | 5/2008 | Blanz et al. ................. 324/303 |
| 7,492,154 | B2 * | 2/2009 | Lucas et al. ................. 324/309 |
| 2004/0066193 | A1 | 4/2004 | Ardenkjaer-Larsen et al. |

FOREIGN PATENT DOCUMENTS

| WO | WO-02/36005 | 5/2002 |
| WO | WO-02/37132 | 5/2002 |

OTHER PUBLICATIONS

Farrar, C. T. et al., High-Frequency Dynamic Nuclear Polarization in the Nuclear Rotating Frame, Journal of Magnetic Resonance, Academic Press, Orlando, FL, vol. 144, No. 1, May 2000, pp. 134-141.

* cited by examiner

*Primary Examiner*—Louis M Arana
(74) *Attorney, Agent, or Firm*—Blank Rome LLP

(57) ABSTRACT

A method of operating a DNP system comprising: a cryostat (1); a magnetic field generator (2) located in the cryostat for generating a magnetic field in a working volume; a microwave cavity (8) within which the working volume is located; and a waveguide (18) for supplying microwave power to the microwave cavity; the method comprising: a) locating a sample in the working volume and subjecting the sample to a magnetic field generated by the magnetic field generator; b) supplying liquid coolant to the working volume to cool the sample; c) irradiating the sample with microwave power so as to hyperpolarize nuclear spins in the sample; and d) warming the sample following the irradiation step by expelling liquid coolant from the working volume while leaving the sample in the working volume.

19 Claims, 8 Drawing Sheets

METHOD OF OPERATING A DYNAMIC NUCLEAR POLARIZATION SYSTEM

CROSS-REFERENCE TO RELATED APPLICATION

This application is a national phase of PCT/GB2006/000653, filed Feb. 24, 2006, published in English on Oct. 12, 2006, as WO 2006/106285 A1, which claims priority to GB 0507174.1, filed Apr. 8, 2005. The disclosures of both of those applications are hereby incorporated by reference in their entireties into the present disclosure.

The invention relates to a method of operating a dynamic nuclear polarization system.

Dynamic nuclear polarisation (DNP) is used to enhance the nuclear polarisation of samples for use in applications such as nuclear magnetic resonance (NMR) analysis including nuclear magnetic resonance imaging (MRI) and analytical high-resolution NMR spectroscopy (MRS). MRI is a diagnostic technique that has become particularly attractive to physicians as it is non-invasive and does not involve exposing the patient under study to potentially harmful radiation such as X-rays. Analytical high resolution NMR spectroscopy is routinely used in the determination of molecular structure.

MRI and NMR spectroscopy lack sensitivity due to the normally very low polarisation of the nuclear spins of the materials used. In view of this, the dynamic nuclear polarisation technique has been developed to improve the polarisation of nuclear spins.

In a typical DNP process, a liquid sample is mixed with a polarising agent and placed in a sample cup which is mounted to a sample holding tube. The sample holding tube is then inserted into the bore of a superconducting magnet located in a cryostat so as to bring the sample to a working volume within the bore, the working volume being located in a microwave cavity defined by a DNP insert. The superconducting magnet generates a magnetic field of suitable strength and homogeneity in the working volume.

The sample is cooled and solidified by exposing it to liquid helium in the bore and then irradiated with microwaves while it is exposed to the magnetic field and in its frozen state.

The sample is then lifted out of the liquid helium to a position in which it is still subject to the magnetic field although this may be less homogeneous.

Hot solvent is then supplied into the sample holding tube, typically through a dissolution tube or stick or other solvent conveying system, to the working volume so as to dissolve the polarised sample. Alternatively, the sample may be melted. The solution or melt is then rapidly extracted and transferred for subsequent use either for analysis in an NMR system or, in the case of in vivo applications, injection into a patient.

One of the drawbacks of this system is the need to move the sample out of the working volume in order to remove it from the influence of the liquid helium prior to supplying hot solvent. This is mechanically complex and costly.

In accordance with the present invention, a method of operating a DNP system comprising:

a cryostat;

a magnetic field generator located in the cryostat for generating a magnetic field in a working volume;

a microwave cavity within which the working volume is located; and a waveguide for supplying microwave power to the microwave cavity comprises a) locating a sample in the working volume and subjecting the sample to a magnetic field generated by the magnetic field generator;

b) supplying liquid coolant to the working volume to cool the sample;

c) irradiating the sample with microwave power so as to hyperpolarize nuclear spins in the sample; and d) warming the sample following the irradiation step by expelling liquid coolant from the working volume while leaving the sample in the working volume.

With this invention, instead of moving the sample out of the working volume and influence of the liquid helium, we remove the liquid coolant while leaving the sample in place. This makes the system mechanically much less complex and also minimizes coolant consumption and also reduces heat lost from the solvent during dissolution.

A further advantage is that a dissolution tube or stick can be left in place and that the amount of liquid coolant can be minimized.

The step of expelling liquid coolant can be carried out in a number of ways. The simplest approach is to evaporate the liquid coolant by heating it. To that end, electric heaters can be provided close to the working volume. Another approach is to return the liquid coolant to the liquid coolant containing vessel of the cryostat from which the coolant was supplied. This could be done by pressurizing the bore or applying a vacuum to the vessel.

Typically, the liquid coolant will be liquid helium although the invention is, of course, applicable to the use of other coolants.

An example of a DNP system according to the invention will now be described and compared with a conventional system with reference to the accompanying drawings, in which.

Figure 1:
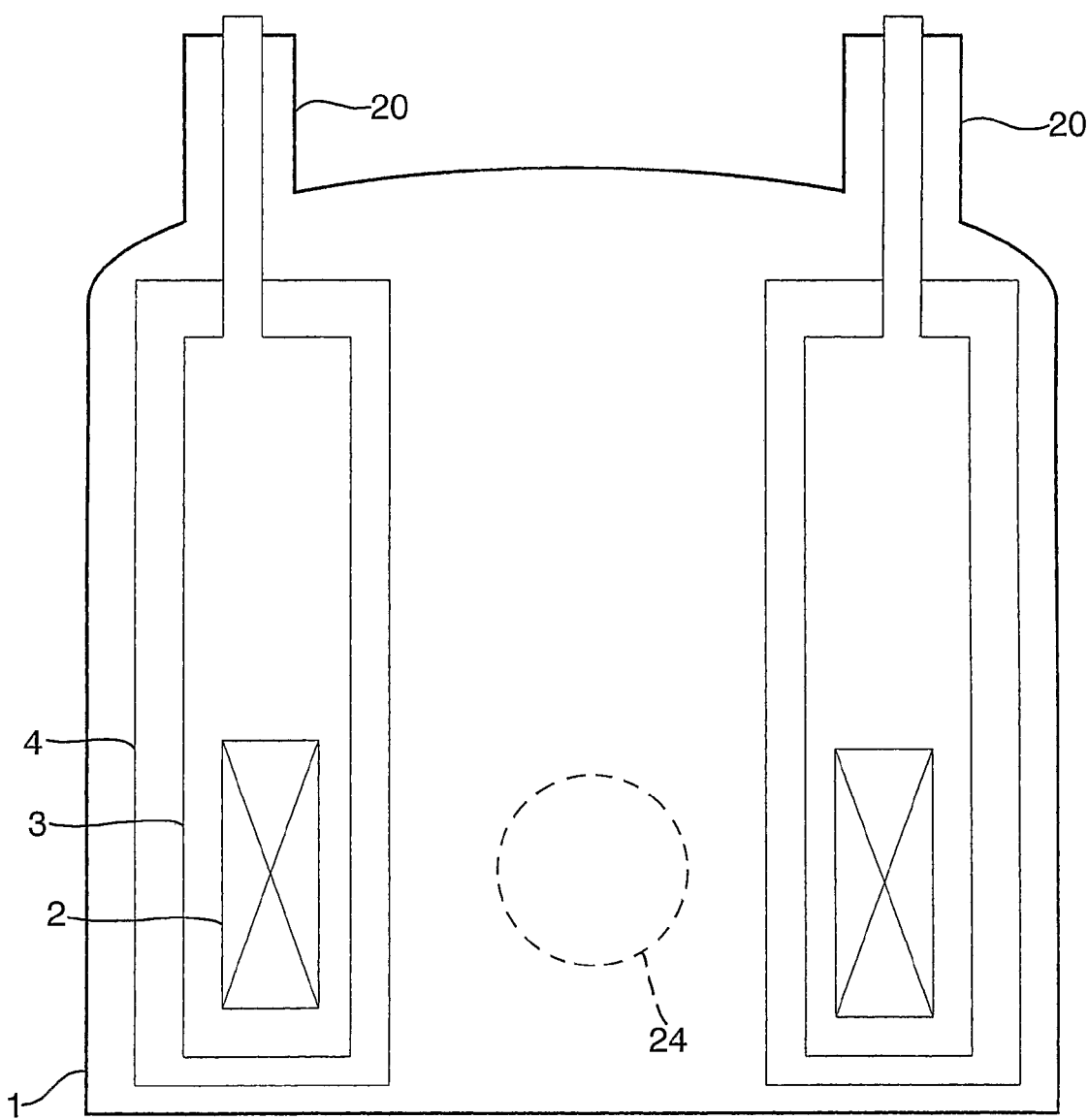
FIG. 1 illustrates in schematic cross-section a conventional cryostat and magnet for DNP.

FIG. 1 shows a standard cryomagnet with outer vacuum chamber (OVC) 1, a magnet 2 generating a uniform magnetic field of several Tesla located in an annular helium vessel 3, and a thermal shield 4 (which can either be cooled by enthalpy of He gas escaping via the necks 20, or by a separate nitrogen jacket). The cold bore 22 inside the thermal shield bore is exaggerated in this drawing and surrounds a working volume 24 in which the magnetic field is uniform to at least 300 ppm, preferably 100 ppm, most preferably better than 50 ppm.

Figure 2:
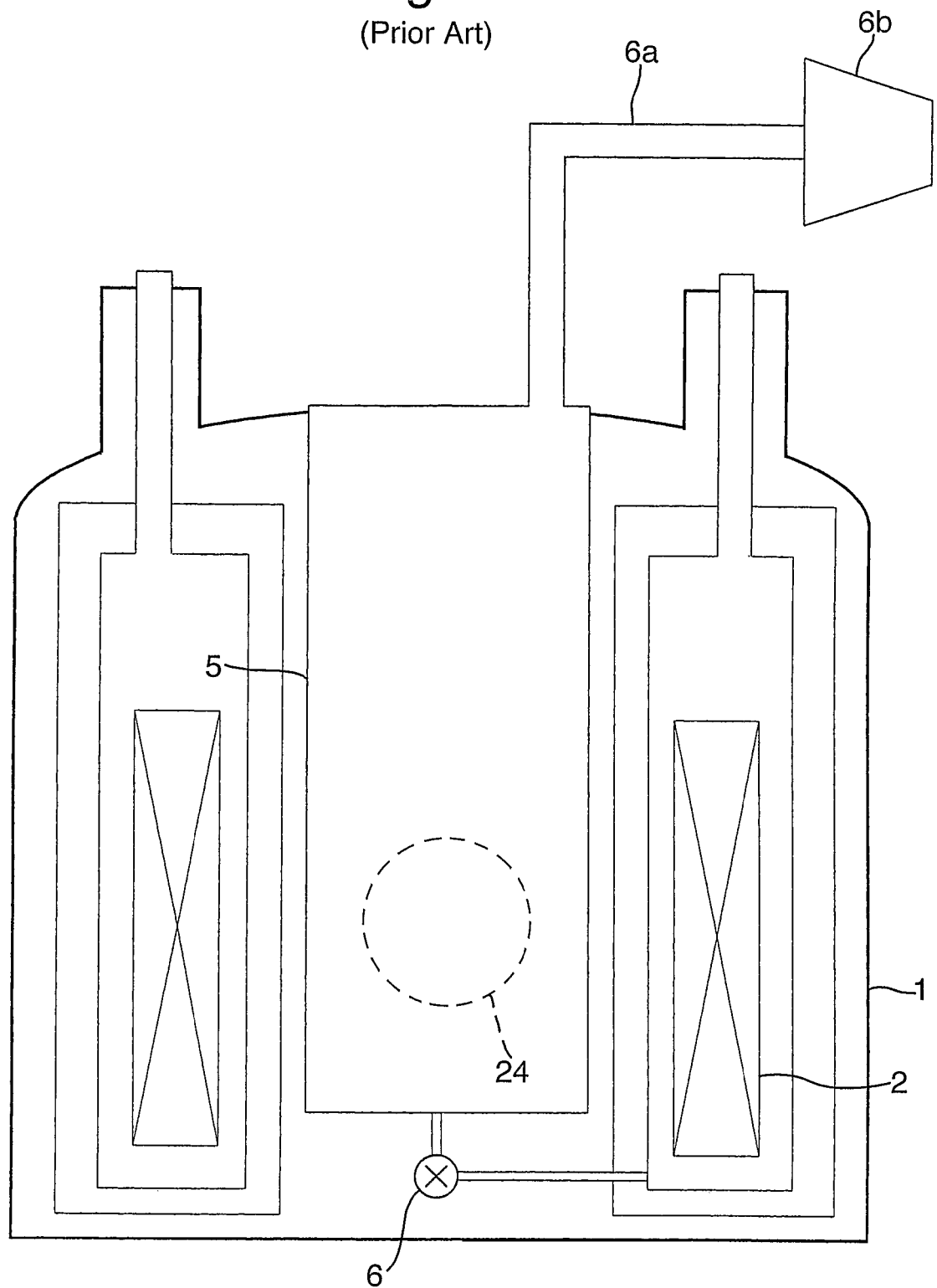
FIG. 2 is similar to FIG. 1 but showing a VTI located in the bore.

FIG. 2 shows a variable temperature insert (VTI) located in the bore 22. The VTI comprises an inner helium vessel 5 within the vacuum chamber. This is fed from the main LHe vessel 3 via a valve 6. A pumping line 6a and pump 6b are used to evacuate the VTI. There is also a hole in the top of the VTI (not shown) through which a DNP insert is loaded during manufacture. This is subsequently sealed. This hardware is permanently fitted.

Figure 3:
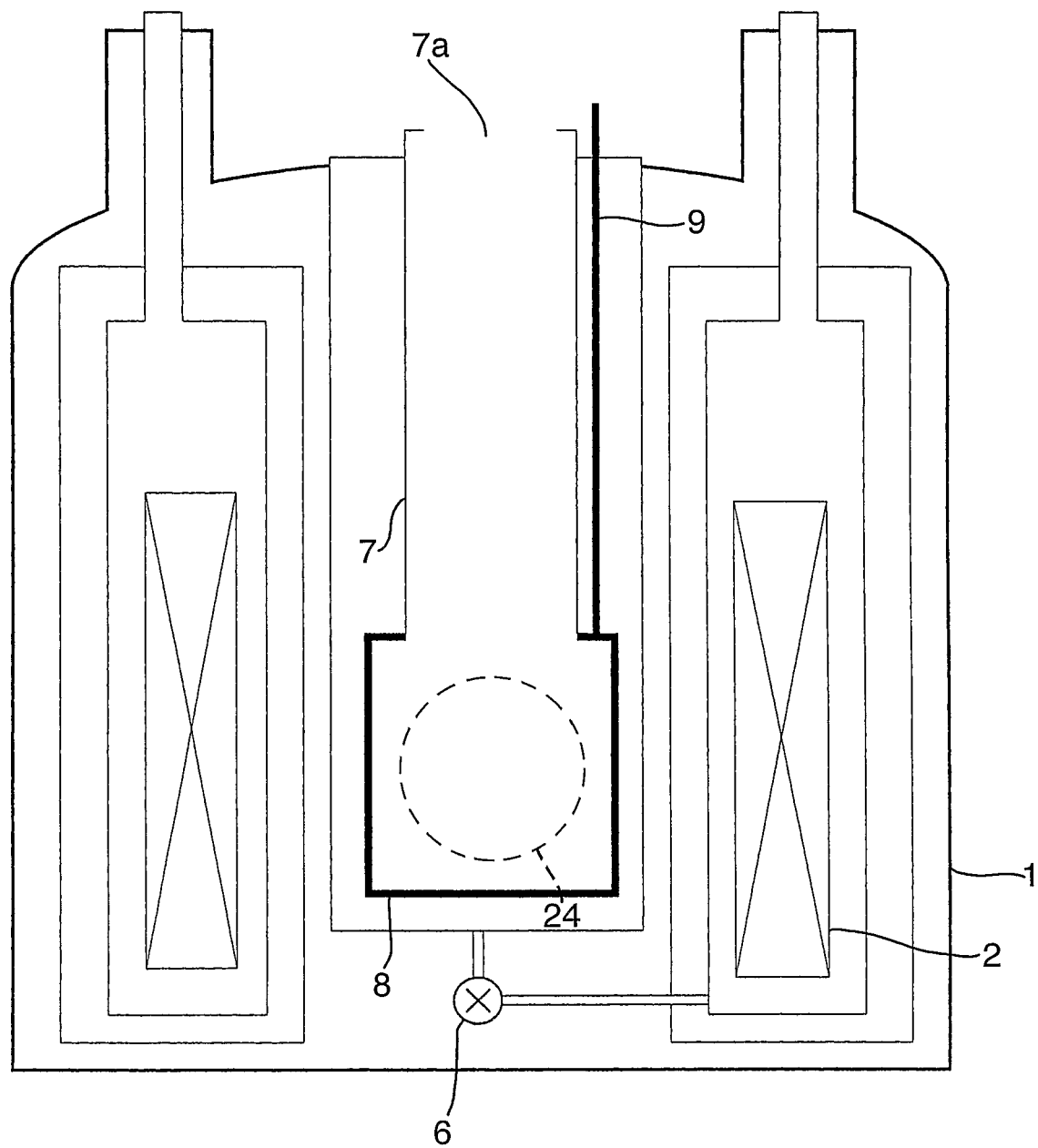
FIG. 3 is similar to FIG. 2 but with a DNP insert.

FIG. 3 shows the DNP insert, comprising a guide tube 7, a conducting metal microwave cavity 8 and a waveguide 9 to feed the cavity. The guide tube 7 can be sealed at its upper opening by any suitable means (e.g. valve or rubber bung, as shown at 11a in FIG. 4). The waveguide 9 is stainless steel to avoid introducing a large heat load to the LHe. The cavity 8 is un-tuned and can be open at the top. There are one or more holes (not shown) in the cavity 8 that allow free entry of helium. If these are small (e.g. mm) they will not affect the electrical properties significantly. This hardware is permanently fitted.

Figure 4:
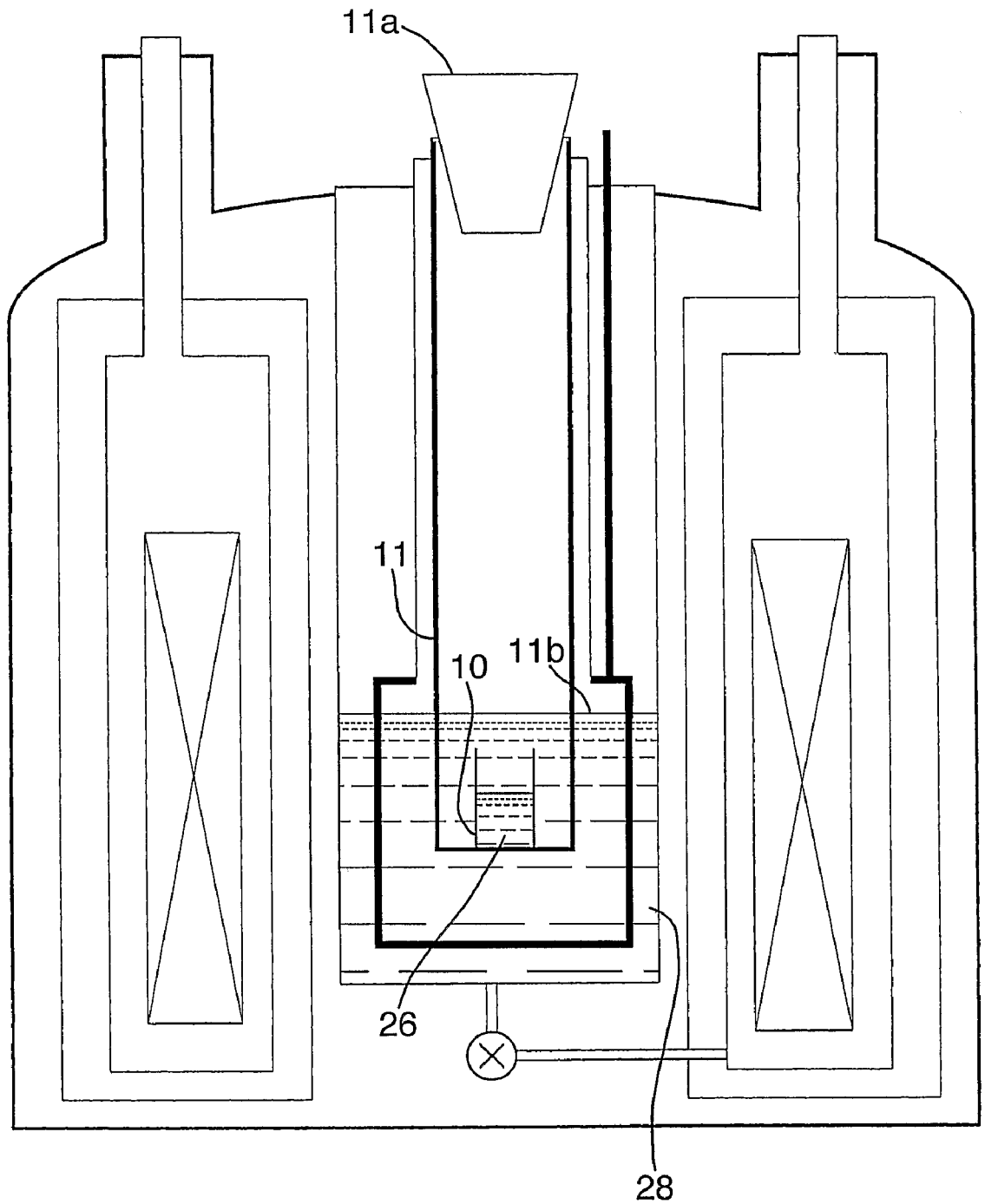
FIG. 4 is similar to FIG. 3 but with sample, sample cup and sample holder added.

FIG. 4 shows a sample 26 inside a sample cup 10, inside a non-metallic (e.g. PTFE) sample holder tube 11. The sample comprises a material to be hyperpolarized mixed with a free radical polarizing agent. This hardware is used to lower the sample into the VTI 5. To do this, the VTI is pressurized, opened to atmosphere, then the sample is loaded, the open top end of the sample holder tube is then closed with a rubber bung 11a, the VTI 5 is refilled with helium, as shown at 28, so that the sample is covered (11b shows LHe level) and then pumped down to sub-cool the sample to ~1.2K. Then the microwaves are supplied to the cavity 8 from a source (not shown) via waveguides 9 to polarise the sample 26.

Figure 5:
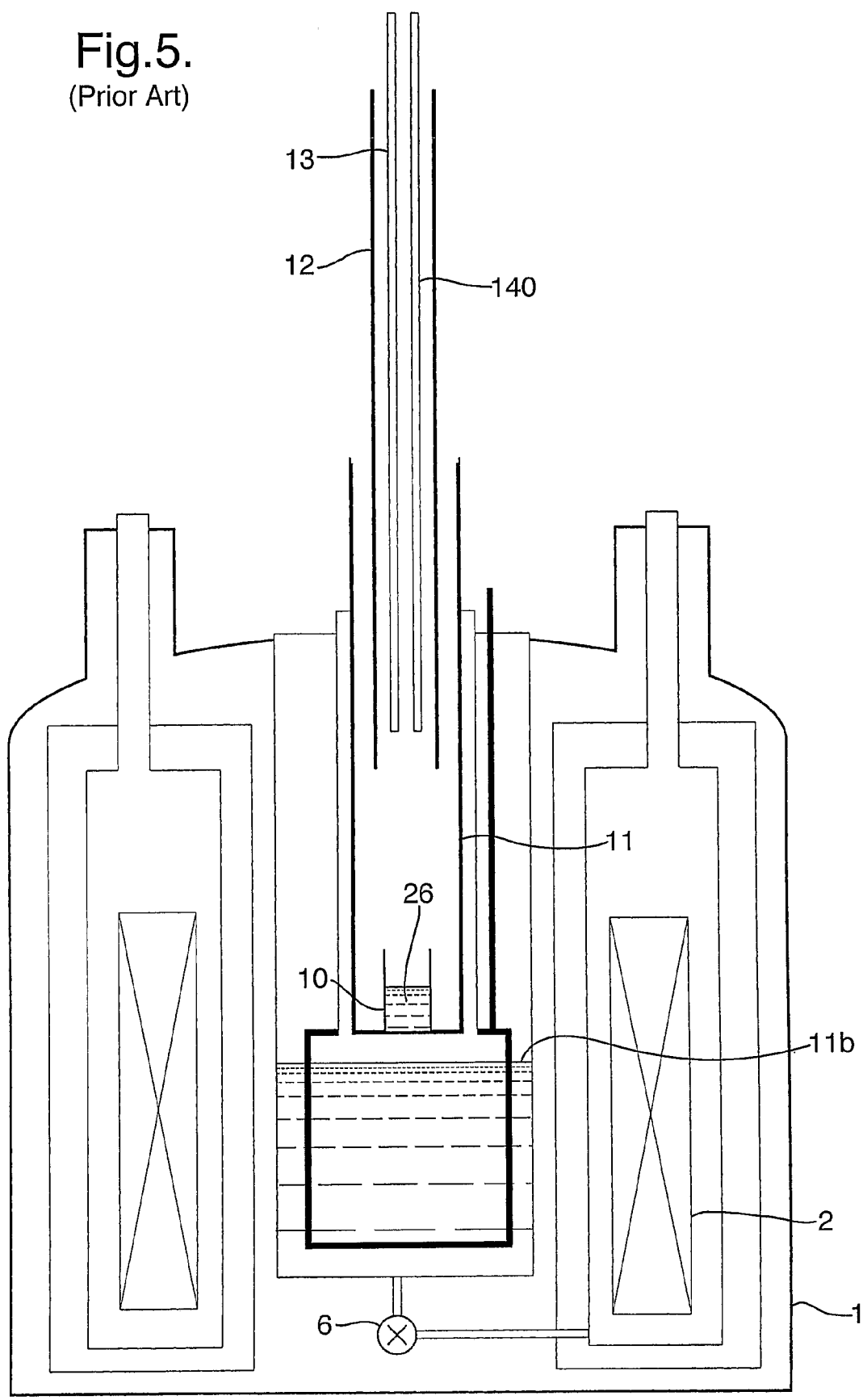
FIG. 5 is similar to FIG. 4 but with a dissolution stick ready to be inserted.

FIG. 5 shows a dissolution stick 12 about to be inserted. When the sample 26 has been polarised, the microwaves are turned off, the VTI 5 is pressurised, the sample holder 11 is raised (so that the sample is above the LHe level 11b, affording crude thermal isolation) and the rubber bung 11a is removed. Hot pressurised solvent has been made ready in a solvent vessel (shown as 14 in FIG. 6).

Figure 6:
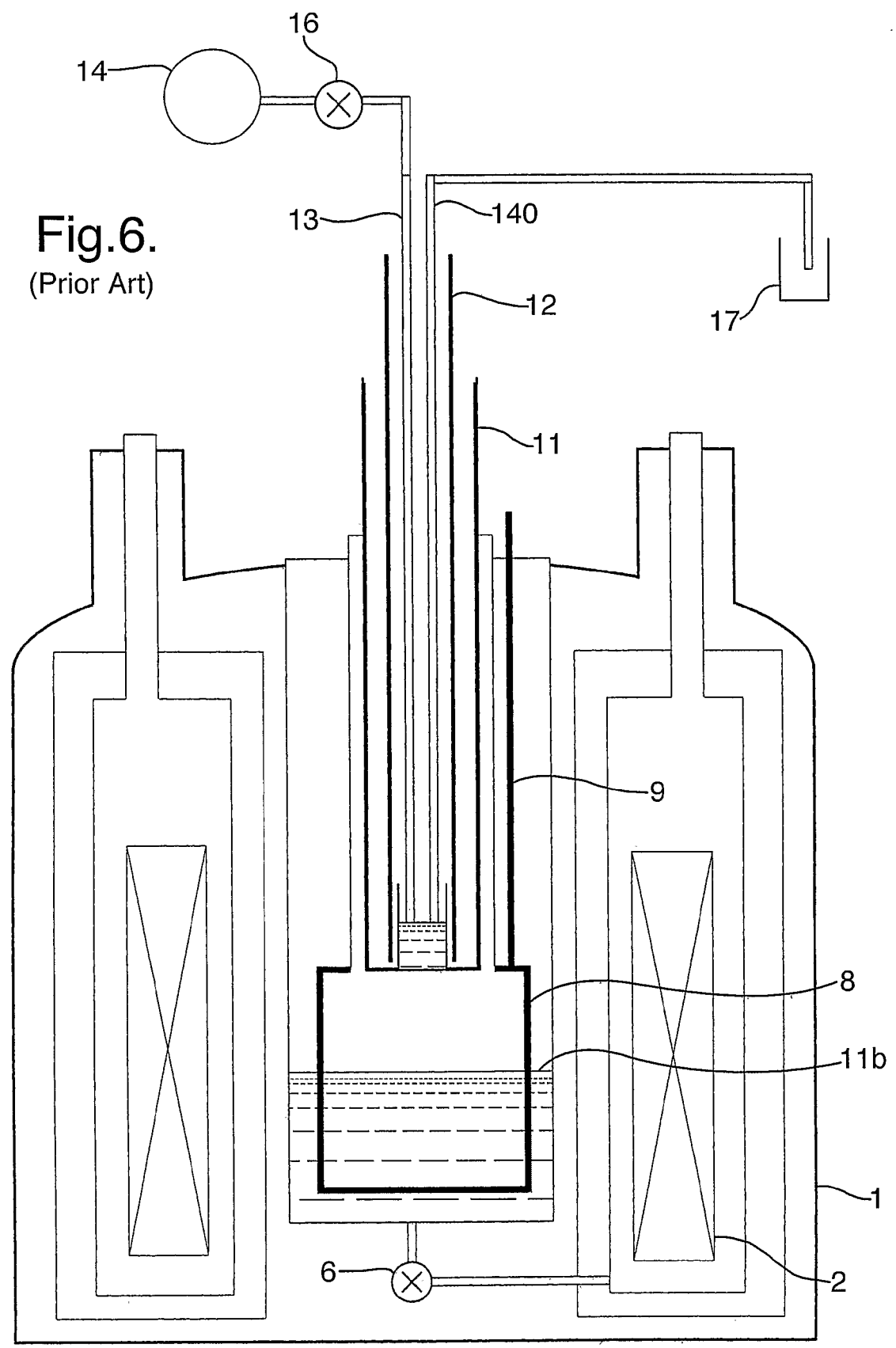
FIG. 6 is similar to FIG. 5 but with the dissolution stick fully inserted.

As shown in FIG. 6, the dissolution stick 12 is lowered into the VTI down the centre of the sample holder tube 11, and as soon as it docks with the sample cup 10, a valve 16 is opened allowing solvent to flow down the inlet pipe 13 and dissolve the sample. The dissolved sample flows up an outlet pipe 14 and into a collection cup 17 (or directly into an NMR tube in a separate magnet).

The problems with the prior art are:
1. The helium level in the VTI falls significantly when a sample is loaded and when the dissolution takes place due to the heat dumped into the VTI (causing high He consumption and slow recovery of He level.
2. There are many parts (expensive).
3. There are moving parts (sample holder and dissolution stick) which are expensive to automate.

Figure 7:
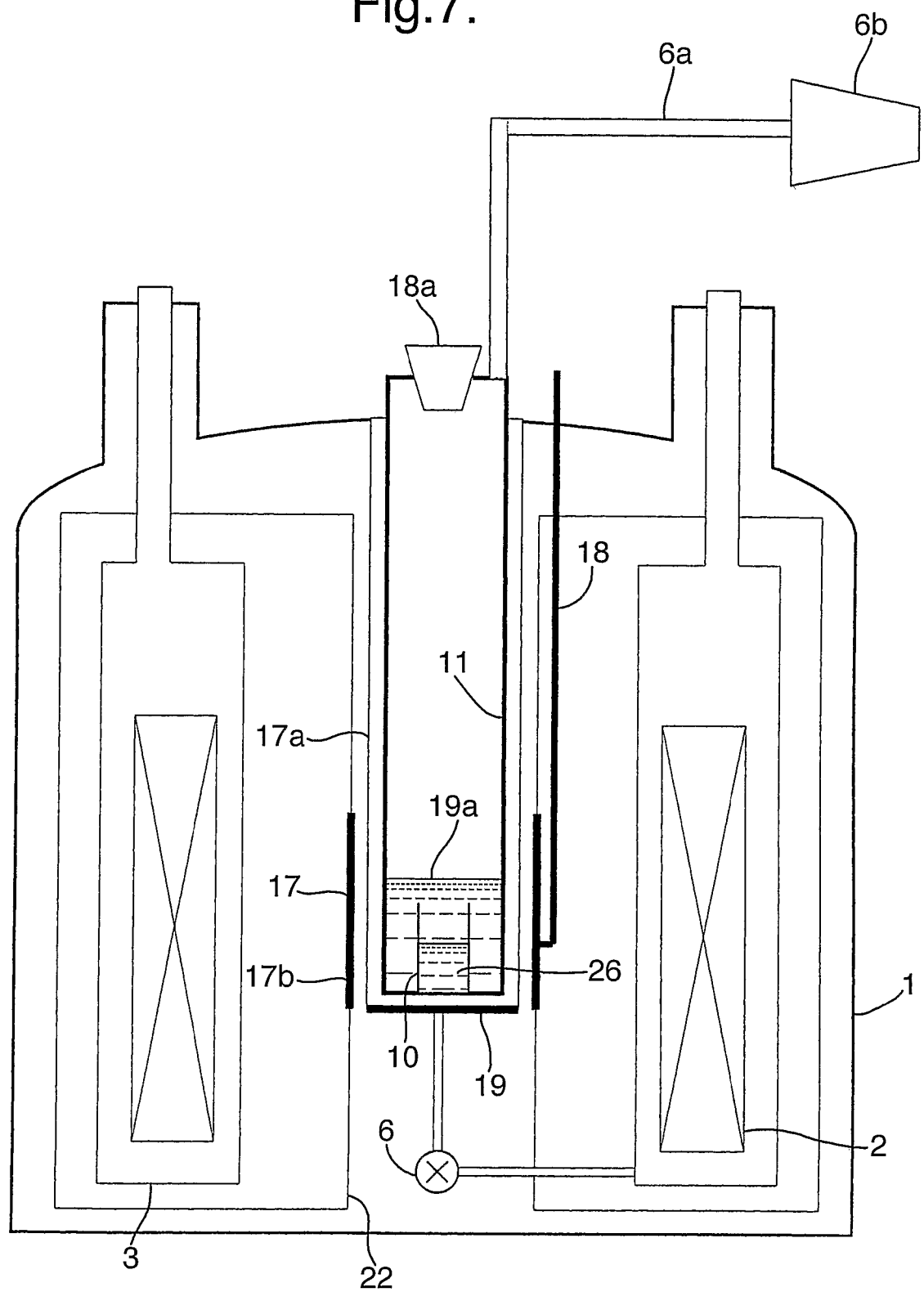
FIG. 7 is a view similar to FIG. 4 but of an example of the invention.

In FIG. 7, showing an embodiment of the invention, the inner bore 22 of the thermal shield 1 is used to form the walls 17b of the microwave cavity 17. A small diameter VTI 17a is now inside the wall 17b of the microwave cavity rather than vice versa. The small diameter VTI 17a has a typical diameter of about 15 mm which should be contrasted with the conventional VTI having a diameter of about 70 mm. It has a pumping line 6a connected to a pump 6b to allow it to be evacuated and a sealable entry at the top (shown here closed with a bung 18a) to allow the sample to be loaded. The base 19 of the VTI is metallic and forms the base of the microwave cavity. The walls of the VTI 17a and the sample holding tube 11 around the sample 26 must be RF transparent (e.g. glass fibre) to allow microwave radiation to reach the sample, and the sample holding tube 11 must be leak tight to superfluid helium (shown at 19a). The waveguide 18 no longer touches LHe and can be thermally anchored to the thermal shield bore 22. It can therefore be made of copper. This reduces the microwave power lost in the waveguide and reduces the overall microwave power requirement and the cost of the source. The sides and base of the microwave cavity 17 are not galvanically or thermally connected (in fact the walls will be at the temperature of the thermal shield and the base at LHe temperature). However, they are electrically connected by capacitive coupling and therefore should act as a non-resonant cavity to localize and concentrate the microwave power density around the sample.

Figure 8:
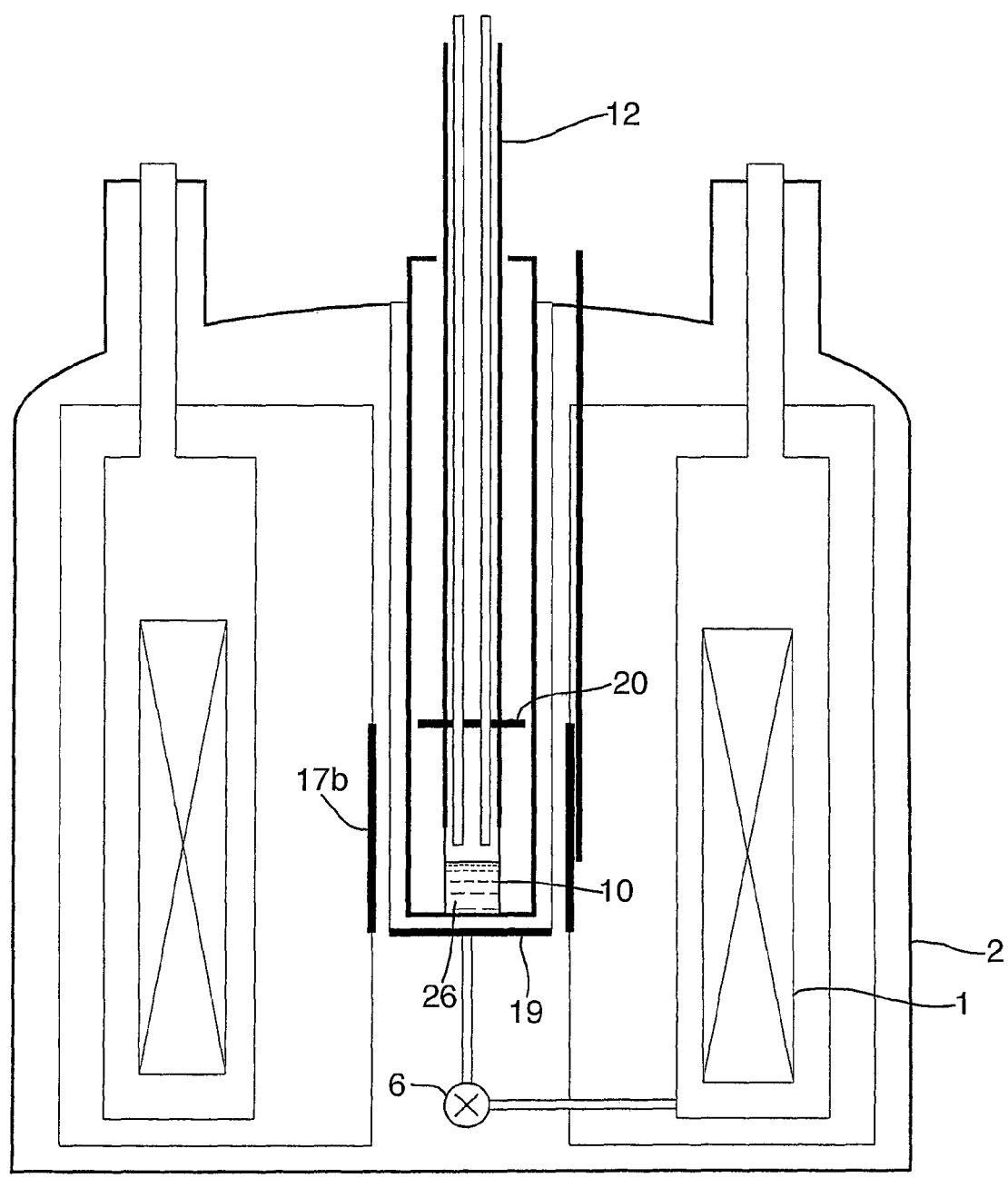
FIG. 8 is a view similar to FIG. 7 but with a dissolution stick inserted and illustrating a modified microwave cavity wall.

After polarising the sample, the microwaves are turned off, the small volume of LHe 19a in the VTI 17a is removed (either by boiling it away, using either ambient heat load or extra heaters (not shown), or by displacing it back into the main reservoir 3 via valve 6 whilst pressurising the VTI, or a combination of these). The net loss of LHe is much less than in the prior art and no movement of the sample holder is required. When the VTI 17a has been pressurised it is opened and the dissolution stick 12 inserted in the usual way (as shown in FIG. 8). Alternatively, the sample could be melted.

In an alternative embodiment, the dissolution stick 12 is loaded at the same time as the sample 26 and remains in place during the polarisation process. This is convenient for the design as the dissolution stick 12 can be used to load the sample and a good seal between the cup 10 and the stick is assured (no "docking" step). In this embodiment, it is possible to close the microwave cavity 17 with a metal disk 20 on the dissolution cup, which will increase the power density in the cavity and further reduce the source power requirement. In this case, the dissolution stick 12 cools to helium temperature during the polarisation period. If solvent were passed into the pipes when cold, it would freeze. To avoid this, we can (non-inductively) wind heating elements around the inlet and outlet pipes 13,140 and quickly heat them after the helium has been displaced from the VTI, but just before the solvent valve is opened. This could be achieved using a high current pulse from a capacitor or battery.

In the examples described, the liquid helium which is supplied to the sample holding tube 11 is fed via the valve 6 from the vessel 3. This is suitable for in-vitro applications but for in-vivo applications, it will normally be necessary to provide a separate, dedicated helium vessel (not shown) coupled with the sample holding tube via a valve.

The invention claimed is:
1. A method of operating a DNP system comprising:
 a cryostat;
 a magnetic field generator located in the cryostat for generating a magnetic field in a working volume;
 a microwave cavity within which the working volume is located; and
 a waveguide for supplying microwave power to the microwave cavity; the method comprising:
 a) locating a sample in the working volume and subjecting the sample to a magnetic field generated by the magnetic field generator;
 b) supplying liquid coolant to the working volume to cool the sample;
 c) irradiating the sample with microwave power so as to hyperpolarize nuclear spins in the sample;
 d) expelling liquid coolant from the working volume while leaving the sample in the working volume; and subsequently
 e) dissolving or melting the hyperpolarized sample in the working volume.

2. A method according to claim 1, wherein the liquid coolant is supplied from a coolant containing vessel of the cryostat.

3. A method according to claim 2, wherein the liquid coolant in the working volume is removed by returning it to the liquid coolant containing vessel of the cryostat.

4. A method according to claim 3, further comprising dissolving the irradiated sample in a solvent and removing the dissolved sample from the working volume.

5. A method according to claim 3, wherein the sample is held in a sample holding tube into which liquid coolant is supplied in step (b).

6. A method according to claim 2, wherein the coolant is liquid helium.

7. A method according to claim 2, wherein the liquid coolant in the working volume is removed by evaporation.

8. A method according to claim 2, further comprising dissolving the irradiated sample in a solvent and removing the dissolved sample from the working volume.

9. A method according to claim 2, wherein the sample is held in a sample holding tube into which liquid coolant is supplied in step (b).

10. A method according to claim 1, wherein the coolant is liquid helium.

11. A method according to claim 10, wherein the liquid coolant in the working volume is removed by evaporation.

12. A method according to claim 10, further comprising dissolving the irradiated sample in a solvent and removing the dissolved sample from the working volume.

13. A method according to claim 10, wherein the sample is held in a sample holding tube into which liquid coolant is supplied in step (b).

14. A method according to claim 1, wherein the liquid coolant in the working volume is removed by evaporation.

15. A method according to claim 14, further comprising dissolving the irradiated sample in a solvent and removing the dissolved sample from the working volume.

16. A method according to claim 14, wherein the sample is held in a sample holding tube into which liquid coolant is supplied in step (b).

17. A method according to claim 1, further comprising dissolving the irradiated sample in a solvent and removing the dissolved sample from the working volume.

18. A method according to claim 17, wherein the sample is held in a sample holding tube into which liquid coolant is supplied in step (b).

19. A method according to claim 1, wherein the sample is held in a sample holding tube into which liquid coolant is supplied in step (b).

* * * * *